United States Patent [19]

Kumar et al.

[11] Patent Number: 5,852,389
[45] Date of Patent: Dec. 22, 1998

[54] DIRECT QAM MODULATOR

[75] Inventors: Surinder Kumar; Abbas Mohammadi; David M. Klymyshyn, all of Saskatchewan, Canada

[73] Assignee: Telecommunications Research Laboratories, Canada

[21] Appl. No.: 837,395

[22] Filed: Apr. 17, 1997

[51] Int. Cl.$^6$ .............................. H03C 3/00; H04L 27/36
[52] U.S. Cl. .......................... 332/103; 332/105; 375/298
[58] Field of Search .................................. 332/103, 104, 332/105; 375/261, 264, 298, 308

[56] References Cited

U.S. PATENT DOCUMENTS

| | | | |
|---|---|---|---|
| 5,140,200 | 8/1992 | Stanton | 307/540 |
| 5,349,312 | 9/1994 | Huettner et al. | 333/81 |
| 5,351,030 | 9/1994 | Kobayashi et al. | 338/295 |
| 5,453,720 | 9/1995 | McCullough et al. | 332/103 |
| 5,477,200 | 12/1995 | Ono | 333/81 |
| 5,502,421 | 3/1996 | Nakahara | 333/81 |

OTHER PUBLICATIONS

A Broadband I & Q Vector Modulator, G. T. Microwave Inc., Microwave Journal, Dec., 1996, p. 108–112.
A Direct 64QAM Modulator Suitable for MMIC Implementation, Surinder Kumar, Abbas Mohammadi, and David Klymyshyn, unpublished submitted and accepted for publication in Microwave Journal, 16 pages.

*Primary Examiner*—David Mis
*Attorney, Agent, or Firm*—Anthony R. Lambert

[57] ABSTRACT

A direct QAM modulator for generating a high power QAM modulated signal at microwave frequencies comprises a hybrid to create the required RF signals for I and Q paths. In each path, a rat-race coupler is used to get the in phase and out of phase RF signal. The subsequent circuit blocks in each path consist of a single pole double throw switch (SPDT) switched by the polarity of the incoming data, a reflection attenuator, implemented by using forward biased pin diode terminations and controlled by the absolute values of the baseband pulse amplitude modulation (PAM) signal, and a variable reflection phase shifter to adjust for the phase error. To realize modulated signal filtering and to compensate for the nonlinearities, a combined prefiltering and predistortion block is used to shape the baseband PAM signal in each path. Finally, a power combiner is used to combine signals from the two paths into one high power QAM modulated and filtered output signal at microwave frequency.

18 Claims, 3 Drawing Sheets

DIRECT QAM MODULATOR

FIELD OF THE INVENTION

This invention relates to quadrature amplitude modulators.

BACKGROUND OF THE INVENTION

This invention finds use in high capacity and high quality digital radio communication systems where a very high speed data has to be transmitted over a limited bandwidth channel. It is particularly well suited when a high efficiency power oscillator can eliminate the requirement for a power amplifier in the transmitter. Such an implementation is desirable in high speed SDH radio networks where a radio system must compete with the capacity and quality, as well as the price of an optical system but has a limited available channel bandwidth.

A conventional Quadrature Amplitude Modulator (QAM) transforms the baseband QAM signal to an IF signal and then to an RF signal. This is generally realized by using a mixer to modulate the signal at an intermediate frequency (IF). The IF frequency modulated signal is upconverted in one or more stages and a power amplifier is used to boost the modulated signal at the transmit frequency to the required power. The compression characteristic of upconverters limits the output signal level and necessitates the use of a power amplifier for the transmitter.

SUMMARY OF THE INVENTION

In the invention described here, a high speed QAM modulator is implemented using two high speed variable attenuators to adjust the level of a high power oscillator signal with the baseband modulating signal. By dividing the RF signal between in phase and quadrature paths, preferably using an identical circuit in each path, and combining the outputs of the two paths, a high speed direct QAM modulator is realized. This method of QAM modulation provides several benefits such as:

a. A unipolar PAM switching which removes the on-off speed limitation of pin diode attenuators.

b. A direct modulation method that eliminates the IF section and one or more upconversion stages.

c. A direct modulation method that eliminates the power amplifier.

d. A high power direct QAM modulator that is simple and cost effective.

Therefore, according to a first aspect of the invention, there is provided a modulator for modulating high speed QAM data onto a carrier signal. The modulator includes a radio frequency oscillator whose output is divided in phase and quadrature components that are supplied to respective phase invariant voltage controlled variable attenuators, which attenuate the respective in phase and quadrature components of the radio frequency output of the oscillator to produce attenuated in phase and quadrature radio frequency signals according to the voltage level of high speed baseband data signals.

Other aspects of the invention include: The variable attenuators preferably each comprise a Lange coupler whose reflection ports are terminated in forward biased PIN diodes. Phase shifters, for example implemented using Lange couplers terminated with varactor diodes, are connected to the output ports of the Lange couplers for compensating phase shifts caused by the different levels of the attenuators. The control signals for the variable attenuators are preferably pre-distorted to accommodate non-linearity of the PIN diodes. The PIN diodes are maintained in a forward biased condition even when the baseband data signals have negative voltage values by forming the absolute value of the baseband data signals. The control signals thus contain less information than the baseband data signals. To avoid loss of the information in the polarity of the baseband signals, different phases of the output of the oscillator are selected using a selector switch controlled by the polarity of the baseband data signals. The selector switch may be formed of a rat race coupler having in phase and out of phase output ports; and a single pole double throw switch responsive to the baseband data signals to connect one of the in phase and out of phase output ports to one of the phase invariant voltage controlled variable attenuators and disconnect the other of the in phase and out of phase output ports.

Other aspects of the invention are described in the detailed description and claims that follow.

BRIEF DESCRIPTION OF THE DRAWINGS

There will now be described preferred embodiments of the invention, with reference to the drawings, by way of illustration only and not with the intention of limiting the scope of the invention, in which like numerals denote like elements and in which.

DETAILED DESCRIPTION OF PREFERRED EMBODIMENTS

The present invention introduces a novel method of implementing a direct high speed quadrature amplitude modulator for high capacity digital radio applications. RF in this patent document refers to radio frequency, including microwave frequency. The preferred implementation is in microwave frequencies, in the range from about 1–100 GHz, although it will be appreciated that the utility of the invention in higher frequencies is only limited by the present availability of components, and not by the principle of operation of the invention. The modulator is implemented using microstrip and coplanar lines with pin and varactor diodes. The block diagram of a 64QAM modulator is shown in FIGS. 1, 1A and 1B and the layout of the modulator is illustrated in FIG. 2.

Figure 1:
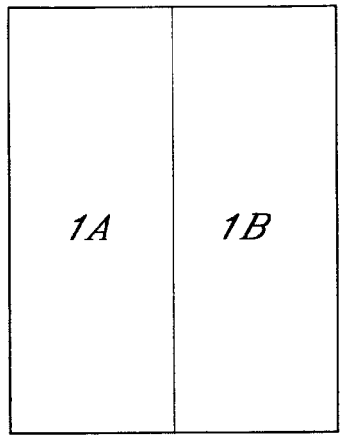
FIGS. 1, 1A and 1B are together schematic illustration of an implementation of a direct high speed QAM modulator according to the invention.
Figure 1A:
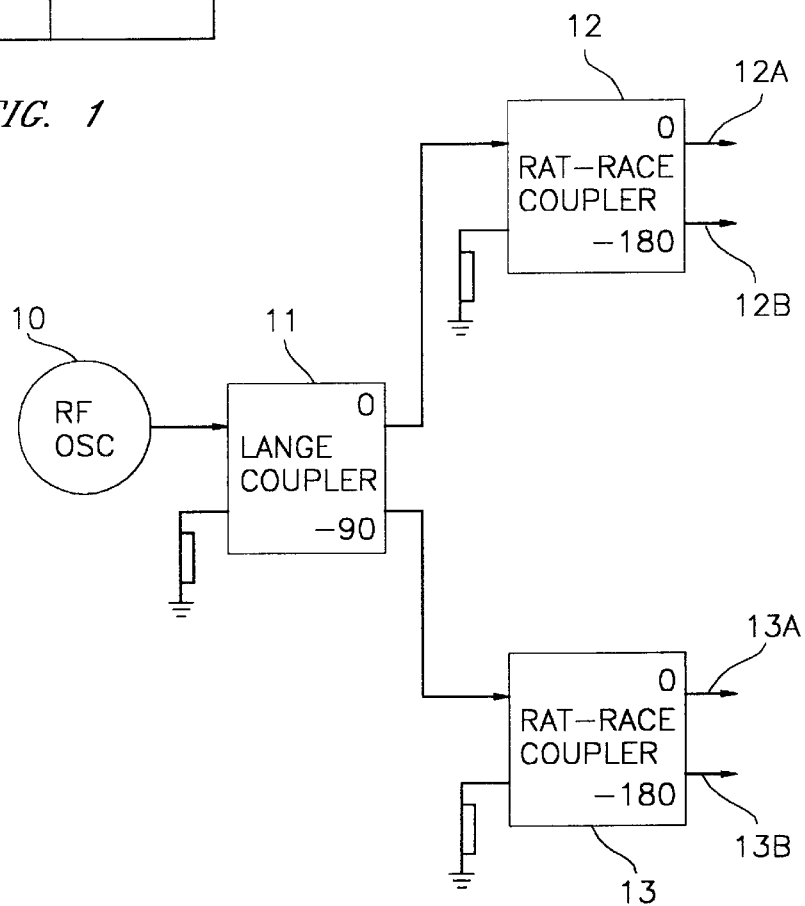
Figure 1B:
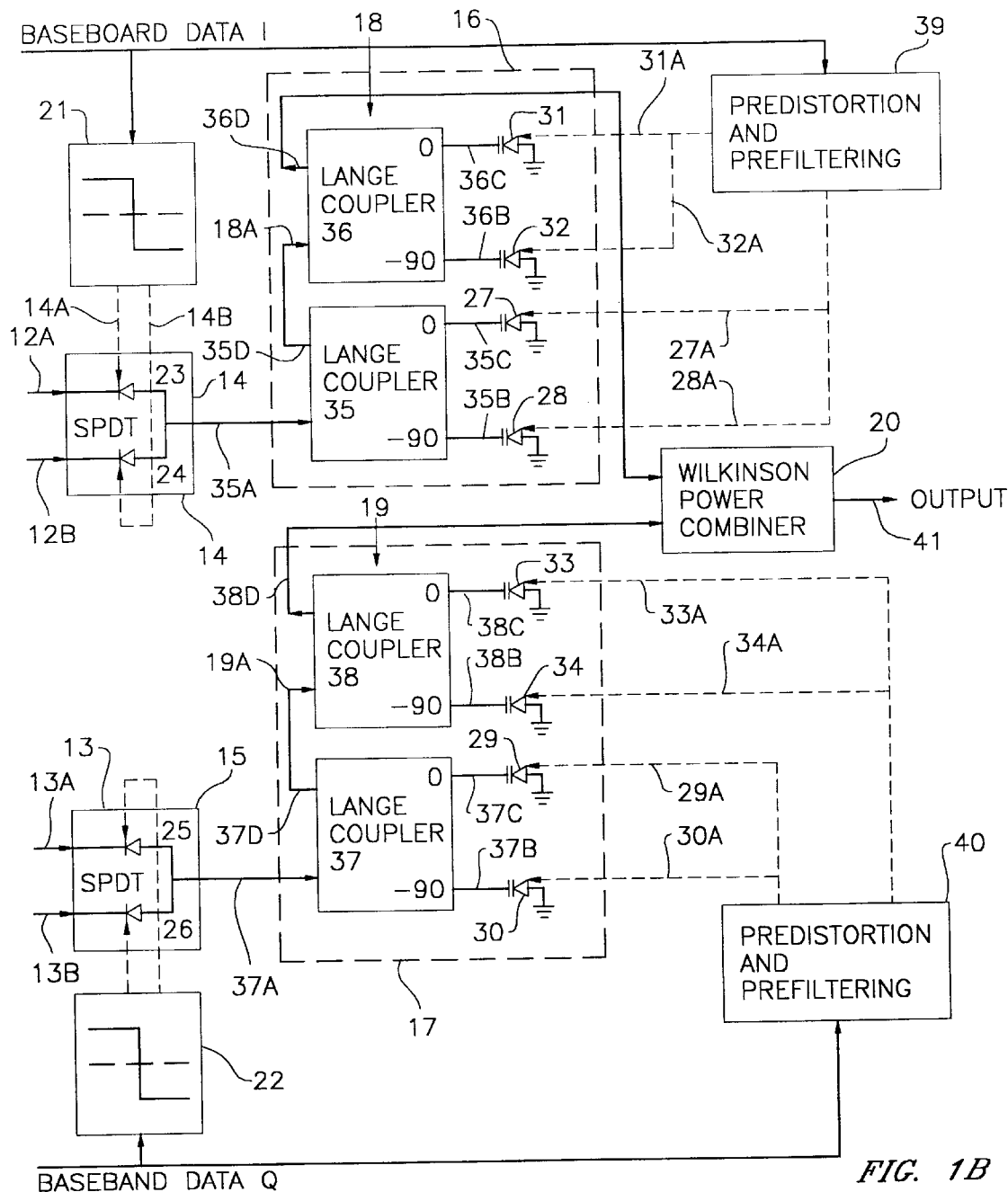
Figure 2:
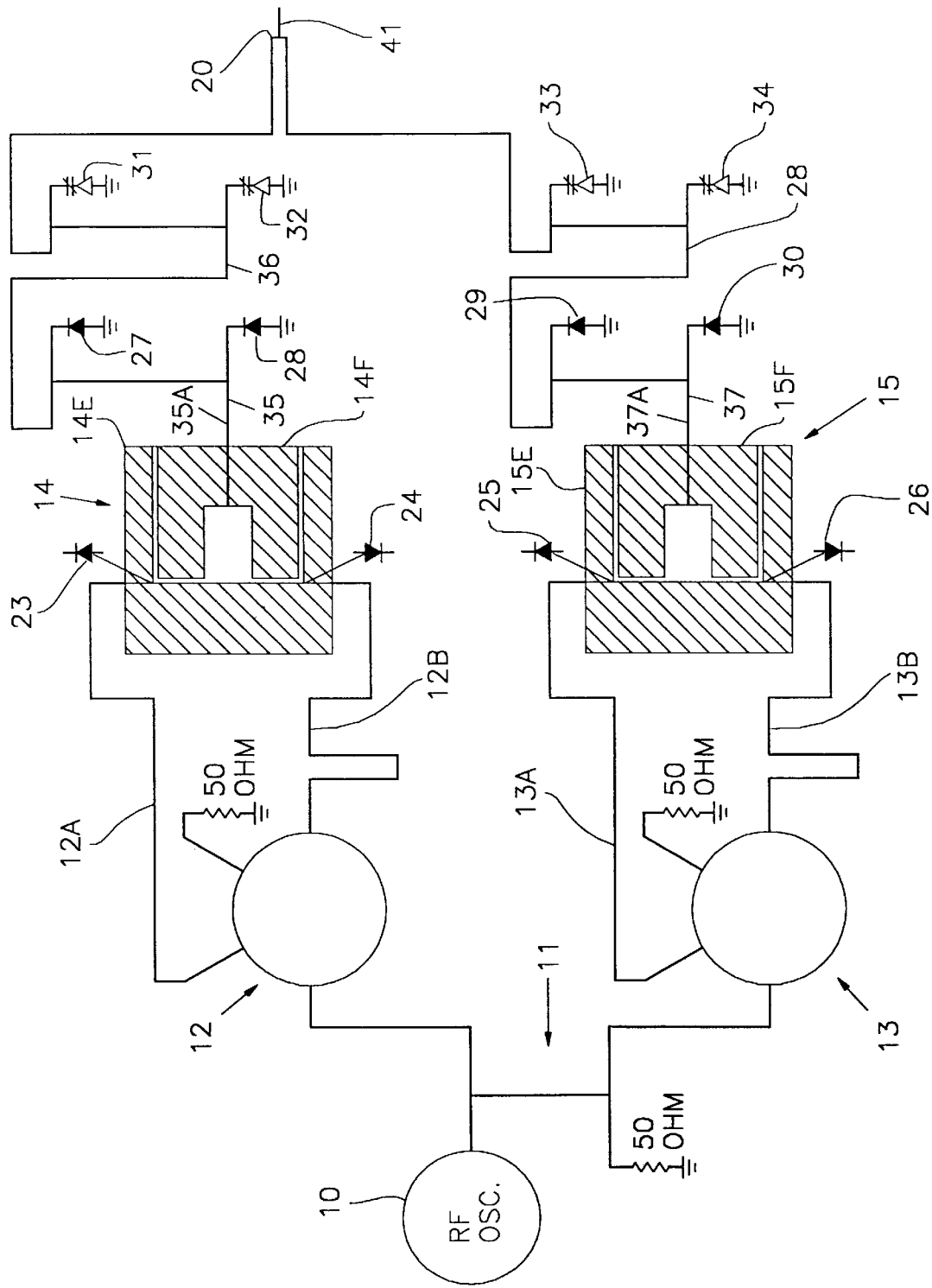
FIG. 2 is a layout illustration of the direct high speed 64QAM modulator of FIGS. 1, 1A and 1B.

The circuit in FIGS. 1, 1A and 1B effectively modulates the signal of a high power oscillator 10 with two eight level PAM signals in the I and Q paths. The modulated I and Q signals are combined to realize the 64QAM modulator. Although the general concept and the circuit architecture is the same for a large range of frequencies, the proposed circuit was implemented at 2.5 GHz band for a 20% operation bandwidth of 500 MHz. A 25 mil thick substrate with $\epsilon_r=10.8$ and metal thickness of 0.15 mil was used.

The circuit implementation of a 64QAM modulator according to the present invention is shown in the attached FIGS. 1, 1A and 1B. As shown in this figure, the radio frequency output signal of the high power oscillator 10 is divided into in phase and quadrature components using a hybrid Lange coupler 11 to obtain the required signals. This Lange coupler 11 has an insertion loss of 3±0.1 dB, a return loss of 24±3 dB, and a phase difference between output ports is close to 90 degree over 500 MHz bandwidth. The Lange coupler 11 is implemented using microstrip.

The in phase output of the coupler 11 is directed to a rat-race coupler 12. The coupler 12 is optimized in accordance with known principles to provide sufficient bandwidth for the modulator. For the inner ring, the impedance steps are optimized. The optimized coupler 12 has an insertion loss of 3±0.2 dB and a minimum return loss 21 dB over 500 MHz. The phase difference between output ports 12a and 12b should be to 180 degree over the bandwidth. The quadrature output of the coupler 11 is connected to another rat-race coupler 13. This coupler 13 is same circuit as the coupler 12. Both couplers 12 and 13 are realized using microstrip.

The in phase and quadrature components of the radio frequency output of the microwave oscillator 10 are directed to phase invariant voltage controlled variable attenuators 16 and 17 respectively. The phase invariant voltage controlled variable attenuators 16 and 17 receive and attenuate the respective components of the radio frequency output of the oscillator 10 to produce attenuated radio frequency signals. In the preferred implementation of the invention, attenuators 16, 17 with PIN diodes 27–30 terminating the reflection ports 35b, 35c, 37b, and 37c are used to modulate the RF signal with high speed baseband data and generate the different levels in the I and Q paths for QAM. This is possible only if the pin diodes 27–30 always operate in the forward biased (ON) condition because of the speed limitation of ON-OFF switching as well as the required flexibility to vary the forward bias resistance. The baseband PAM signal is a bipolar signal and the negative part of the incoming data would reverse bias the pin diodes 27–30 if not corrected. In the preferred implementation, the control signals are formed in blocks 39, 40 by pre-distorting, pre-filtering and forming the absolute value of the high speed baseband data signals, and it is these control signals that are used as control signals for the attenuators 16, 17. Use of the absolute value of the baseband data signals results in a loss of information, namely the polarity of the baseband data signal.

To solve this problem, a single pole double throw (SPDT) switch 14 is used before the variable attenuator. The switch 14 functions as a means for supplying the lost information to the in phase component of the output of the oscillator. The switch 14 is controlled by the polarity of the incoming data at control inputs 14a and 14b. The 0 degree and 180 degree outputs 12a, 12b of the rat-race coupler 12 are selected by the positive or negative polarities of the incoming data, respectively. Polarity is selected using the threshold detector 21. The control signals of the switch are shown with dashed lines 14a and 14b in FIG. 1. The positive polarity of incoming data turns on the pin diode 23 that is connected to the in phase output of coupler 12. The pin diode 24, connected to the out of phase output of coupler 12, is OFF during this time. In this mode the in phase RF signal passes through switch 14. In the other mode, the negative polarity of incoming data turns ON the pin diode 24 and turns OFF the pin diode 23 and the out of phase RF signal passes through switch 14.

The switch 14 is a series SPDT and is preferably implemented using coplanar waveguide lines formed between blocks 14e, 14f as shown in FIG. 2. Equivalent blocks 15e, 15f are used for the switch 15. The diodes 23, 24 control propagation of microwaves in the waveguide lines of the switch 14 by controllably short circuiting the waveguide lines. This coplanar line switch offers much better isolation performance when compared to using a microstrip switch. The gap distance of coplanar waveguide is 1 mil. This gap improves the isolation (27 dB as compared to 17 dB for microstrip) of the switch 14 while maintaining a reasonable insertion loss, comparable to the microstrip realization. The switch 14 uses two impedance steps for each RF power direction and the pin diodes 23 and 24 are Alph 1304 diodes. Using a 20 mA forward bias current, an isolation better than 27 dB and an insertion loss better than 2.2 dB is realized for the switch 14 over the 500 MHz bandwidth. The switch 15 is same as switch 14; however, it switches between the in phase and out of phase outputs 13a, 13b of coupler 13.

The voltage controlled attenuators 16 and 17 are used to obtain the different signal levels required for the 64QAM implementation and are implemented using Lange couplers 35 and 36 respectively. The Lange couplers 35 and 37 have input ports 35a and 37a respectively connected to the outputs 14c, 15c of the SPDT switches 14, 15. The control signal for the attenuator 16 is the absolute value of an eight level baseband PAM signal in the I path. A reflection attenuator using two pin diodes 27 and 28 as terminations at the outputs 35b, 35c of the Lange coupler 35 is used to implement the attenuator 16. The characteristics of the coupler 35 are similar to the input coupler 11. The pin diodes 27 and 28 are preferably Alph 1304 diodes. The dynamic range of the variable attenuator 16 is 12 dB with pin diode current range of 1 to 20 mA and its return loss is better than 25 dB over 500 MHz bandwidth.

The attenuation is flat over the bandwidth, however, the phase shift related to different levels of attenuation are different. Over the attenuator dynamic range in the preferred implementation, there is a deviation in phase shift of about 30 degree associated with different levels of attenuation. The predistortion and prefiltering block 39 applies the required bias currents for the absolute values of an eight level baseband PAM to the pin diodes 27 and 28. Forming the absolute value of the baseband data is accomplished using conventional means in the block 39 which drives the PIN diodes. The control signals are adjusted according to the required filtering and PIN diode current-forward resistance characteristics. The control signals are shown with dashed lines 27a, 28a in FIGS. 1, 1A and 1B. For the Q path, the variable attenuator 17 uses Lange coupler 37 and the pin diodes 29 and 30 with control lines 29a, 30a functioning like attenuator 16. When the PIN diodes 27–30 are maintained in the forward biased condition at the reflection ports of the Lange couplers 35, 36, the PIN diodes function as variable resistances whose resistance is proportional to the voltage level of the control signals.

In the preferred implementation of the variable attenuator, the output 35d of the Lange coupler 35 feeds the input 38a of a variable phase shifter 18 implemented with a Lange coupler 36 having two reflection ports 38b, 38c and an output 38d. The shifter 18 is preferably a reflection type phase shifter on microstrip using two varactor diodes 31 and 32 (Alpha 120412) at the reflection ports 18b, 18c and a Lange coupler 36 similar to coupler 11. The attenuation variation of this phase shifter is less than 0.25 dB and the return loss is better than 25 dB over the 12 volt varactor bias and 500 MHz bandwidth. The phase shifter 18 offers a 40 degree phase shift over the varactor bias voltage range. The block 39 also provides the required control signal voltages at input 31a, 32a for varactor diodes 31 and 32 to compensate for the phase shift error of different levels of attenuator 16 corresponding to the baseband PAM. Similarly, the phase shifter 19 uses a Lange coupler 38 and two varactor diodes 33 and 34 to compensate the phase shift error at different attenuation levels of attenuator 17 using control signals supplied through lines 33a, 34a from the predistortion and prefiltering block 40. The elements in the quadrature path have the same function and design as the corresponding elements in the in phase path.

A Wilkinson power combiner 20 is used to combine the attenuated in phase and quadrature radio frequency signals output from 36d, 38d of the two paths to form an output signal at 41. The combiner 20 is preferably a three section power combiner with termination resistances of 400, 200, and 100 ohm. The combiner 20 is implemented using microstrip lines.

The signal error for the 64QAM modulator shown in FIGS. 1, 1A and 1B is less than 10 percent over the 20 percent bandwidth and the return loss and insertion loss of the I and Q paths have identical performance. The phase difference variation of I and Q paths over the 20 mA current dynamic range is less than 1 degree.

Replacing the conventional mixer with a phase invariant voltage controlled attenuator eliminates the requirement for a filter at the mixer output to suppress the LO leakage. Also, the power output of a mixer must be kept low to limit the nonlinear distortion. Use of Lange couplers with forward biased pin diode terminations solves the problem of hysteresis effects when the pin diodes are switched from the forward to reverse biased states. This problem is avoided because both in phase and out of phase signals are selected by the SPDT preceding the attenuator. The current drivers for the pin diodes are adjusted to achieve the correct signal levels. Differential phase shifts associated with different levels of attenuation using a PIN diode reflection structure are solved by incorporating the phase compensator after the attenuator. Over the 500 MHz operation bandwidth and the attenuation range of −10 dB to −24 dB, a phase compensation of almost 30 degrees is required. Spectrum shaping of the modulated signal and nonlinear compensation for pin diode bias is accomplished using a baseband prefiltering and predistortion block as a supply source for the control signals of the variable attenuator.

In an alternative configuration, the variable attenuators 16, 17 may be implemented using other semiconductor devices such as GaAsFET transistors as an alternative to the PIN diodes terminating the Lange couplers 35 and 37, such as described in Huettner, U.S. Pat. No. 5,349,312. However, in higher power applications, the PIN diodes offer better performance. For polarity reversal, a step phase shifter (with two phase shifts of 0 degree and 180 degree) may be used instead of the coupler. A simple method is to use a 180 degree delay line. The polarity of the RF signal will be reversed if it passes through the delay line. Using a circulator and a control switch, it is possible to realize a reflection type phase shifter. However, the preferred implementation described offers wider bandwidth when compared with the delay line and a simpler circuit when compared with the circulator phase shifter.

Predistortion is required in the preferred implementation to ensure a linear relation between the forward bias resistance of the PIN diodes and their bias currents. Prefiltering (with a Nyquist filter) is required to minimize intersymbol interference.

While a preferred implementation has been described, the invention is not limited to the exemplary features described. A person skilled in the art will appreciate that immaterial variations are intended to be encompassed within the scope of the invention.

The embodiments of the invention in which an exclusive property or privilege is claimed are defined as follows:

1. A modulator for modulating high speed QAM data onto a carrier signal, the modulator comprising:
   an oscillator having radio frequency output;
   a coupler connected to the oscillator for dividing the output of the radio frequency oscillator into in phase and quadrature components;
   a first phase invariant voltage controlled variable attenuator connected to the coupler for receiving and attenuating the in phase component of the radio frequency output of the oscillator to produce attenuated in phase radio frequency signals;
   a second phase invariant voltage controlled variable attenuator connected to the coupler for receiving and attenuating the quadrature component of the output of the radio frequency oscillator to produce attenuated quadrature radio frequency signals;
   means for supplying control signals having plural voltage levels corresponding to baseband data signals to the first and second phase invariant voltage controlled variable attenuators to control attenuation of the in phase and quadrature components of the oscillator, in which the control signals contain less information than is contained in the baseband data signals;
   means for supplying the in phase and quadrature components with information in the baseband data signals that is not contained in the control signals; and
   a combiner for combining the attenuated in phase and quadrature radio frequency signals.

2. The modulator of claim 1 in which the oscillator is a microwave oscillator, the baseband data signals have a magnitude, and each of the first and second phase invariant voltage controlled variable attenuators comprises:
   a coupler having an input port, an output port, and a pair of reflection ports:
   the reflection ports being terminated respectively by semiconductor devices acting as variable resistances whose effective resistance is proportional to the magnitude of the baseband data signals, the semiconductor devices being driven by the means for supplying the control signals.

3. The modulator of claim 2 further including means associated with each phase invariant voltage controlled variable attenuator for maintaining the semiconductor devices as variable resistances even when the baseband data signals have negative voltage values.

4. The modulator of claim 3 in which the means for supplying information to the in phase and quadrature components comprises:
   first selector means for selecting a first phase of the in phase component of the oscillator in response to the baseband data signals having a first polarity and for selecting a second phase of the in phase component of the oscillator in response to the baseband data signals having a second polarity;
   second selector means for selecting a first phase of the quadrature component of the oscillator in response to the baseband data signals having a first polarity and for selecting a second phase of the quadrature component of the oscillator in response to the baseband data signals data having a second polarity; and
   the first and second selector means being operatively connected to the first and second phase invariant voltage controlled variable attenuators.

5. The modulator of claim 4 in which each of the first and second selector means comprises:
   a rat race coupler having in phase and out of phase output ports; and
   a single pole double throw switch responsive to the baseband data signals to connect one of the in phase and out of phase output ports to one of the phase invariant voltage controlled variable attenuators and disconnect the other of the in phase and out of phase output ports.

6. The modulator of claim 5 further comprising, for each single pole double throw switch, a threshold detector for selecting a switch condition corresponding to the polarity of the baseband data signals.

7. The modulator of claim 4 in which the semiconductor devices each comprise PIN diodes.

8. The modulator of claim 7 in which each of the first and second phase invariant voltage controlled variable attenuators further comprises:

first and second phase shifters connected respectively to the output ports of the couplers for compensating phase shifts associated with different levels of attenuation.

9. The modulator of claim 8 in which the first and second phase shifters each comprise:

a coupler with first and second reflection ports, each reflection port being terminated in a varactor diode controlled by the control signals.

10. The modulator of claim 8 in which the resistance of the PIN diodes varies non-linearly with voltage applied to the PIN diodes, and the means for supplying control signals comprises:

means to pre-distort the control signals to accommodate non-linearity of the PIN diodes.

11. The modulator of claim 10 in which the means for maintaining the semiconductor devices in a forward biased condition comprises means for forming the absolute value of the baseband data signals.

12. The modulator of claim 11 in which the dynamic range of the modulator is at least 20 mA and phase difference variation of the attenuated in phase and quadrature radio frequency signals over the dynamic range is less than 1 degree.

13. The modulator of claim 4 in which the means to divide the output of the oscillator into in phase and quadrature components comprises a hybrid coupler.

14. The modulator of claim 4 in which the combiner is a Wilkinson combiner.

15. The modulator of claim 2 in which each of the return loss and the insertion loss of the attenuated in phase radio frequency signal are substantially the same as the return loss and the insertion loss of the attenuated quadrature radio frequency signal.

16. A direct QAM modulator for modulating baseband data, the direct QAM modulator comprising:

a microwave oscillator having an output;

a control signal source of pre-distorted and pre-filtered control signals corresponding to baseband data;

a divider for dividing the output of the microwave oscillator into in phase and quadrature components;

a first variable attenuator comprising a first coupler having a first input port, first and second reflection ports and a first output port, the first and second reflection ports each terminating in a forward biased PIN diode, the forward biased PIN diodes having resistance controlled by the control signals, and first means connected to the first output port for compensating for phase variations induced by the first coupler to produce amplitude modulated in phase signals;

a second variable attenuator comprising a second coupler having a second input port, third and fourth reflection ports and a second output port, the third and fourth reflection ports each terminating in a forward biased PIN diode, the forward biased PIN diodes having resistance controlled by the control signals, and second means connected to the second output port for compensating for phase variations induced by the second coupler to produce amplitude modulated quadrature signals;

a first single pole double throw switch for selecting a first phase of the in phase output from the divider when baseband data is positive and a second phase of the in phase output from the divider when baseband data is negative, the first single pole double throw switch being connected to provide the first and second phases to the first input port of the first variable attenuator;

a second single pole double throw switch for selecting a first phase of the quadrature output from the divider when baseband data is positive and a second phase of the quadrature output from the divider when the baseband data is negative, the second single pole double throw switch being connected to provide the first and second phases of the quadrature component to the second input port of the second variable attenuator;

the control signal source comprising a pre-distortion and prefiltering circuit connected to the PIN diodes for compensating for non-linearity of the PIN diodes; and a combiner for combining the amplitude modulated in phase and quadrature signals.

17. The direct QAM modulator of claim 16 in which the control signal source further comprises means for forming the absolute value of the baseband data, whereby control signals from the control signal source maintain the PIN diodes in a forward biased condition.

18. The direct QAM modulator of claim 17 in which each of the first and second means for compensating for phase shifts induced by the variable attenuator comprises a coupler with a pair of reflection ports terminated with varactor diodes, the varactor diodes being controlled by the control signals.

* * * * *